(12) United States Patent
Haehn

(10) Patent No.: US 6,825,688 B1
(45) Date of Patent: Nov. 30, 2004

(54) SYSTEM FOR YIELD ENHANCEMENT IN PROGRAMMABLE LOGIC

(75) Inventor: Steven L. Haehn, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/641,799

(22) Filed: Aug. 15, 2003

(51) Int. Cl.[7] .............................................. H03K 19/03
(52) U.S. Cl. ............................................. 326/38; 326/10
(58) Field of Search ........................ 326/9, 10, 37–41; 716/4

(56) References Cited

U.S. PATENT DOCUMENTS

| | | | | |
|---|---|---|---|---|
| 5,777,887 A | * | 7/1998 | Marple et al. ................. | 716/4 |
| 5,790,771 A | * | 8/1998 | Culbertson et al. ............ | 714/3 |
| 6,167,558 A | * | 12/2000 | Trimberger .................. | 716/16 |
| 6,201,404 B1 | * | 3/2001 | Reddy et al. .................. | 326/10 |
| 6,545,501 B1 | * | 4/2003 | Bailis et al. .................. | 326/10 |

* cited by examiner

Primary Examiner—Don Le
(74) Attorney, Agent, or Firm—Trexler, Bushnell, Giangiorgi, Blackstone & Marr, Ltd.

(57) ABSTRACT

A system is provided for yield enhancement in programmable logic. The system includes first and second random combinational logic, first and second sets of IP logic blocks, and first and second BIST/MUX controllers. The first controller is electrically connected between the first logic and each of the blocks in the first set and electrically connected between each of the blocks in the first set and the second logic. The second controller is connected in the same manner with respect to the second set of blocks. The controllers are configured to test the blocks for functionality or non-functionality, to identify functional ones of the blocks and to provide electrical connections between a predetermined number of the functional blocks and the first and second logic.

17 Claims, 2 Drawing Sheets

SYSTEM FOR YIELD ENHANCEMENT IN PROGRAMMABLE LOGIC

BACKGROUND

The present invention generally relates to a system for yield enhancement in programmable logic. More specifically, the present invention relates to a system for enhancing yield by using redundant intellectual property logic blocks.

Yield enhancement is an ongoing challenge with any technology and plays a primary role in achieving profitability. The only way to improve yield on standard cell ASIC/ASSP devices is to eliminate the manufacturing defects. Traditional yield enhancement is costly and time consuming. Additionally, no manufacturing process can eliminate all defects and thus there will always be an underlying baseline defect density.

FIG. 1 shows a typical design which is built with a base configuration that includes intellectual property (IP) logic blocks 20a, 20b, 20c, 20d; 22a, 22b, 22c, 22d provided on a die. As shown, there are two sets of IP logic blocks, i.e. IP logic block One 20a, 20b, 20c, 20d and IP logic block Two 22a, 22b, 22c, 22d, and there are four instances of each IP logic block 20a, 20b, 20c, 20d; 22a, 22b, 22c, 22d provided on the die. Predetermined ones of IP logic block One 20a, 20b are electrically connected between random combinational logic 24, 26 by respective lines. The random combinational logic 24 provides inputs into the predetermined ones 20a, 20b of the IP logic block One. The predetermined ones 20a, 20b of IP logic block One provide outputs to the random combinational logic 26. In the design shown in FIG. 1, only two 20a, 20b of the four instances of IP logic block One are required. The remaining two 20c, 20d instances of IP logic block One are unused. Predetermined ones of IP logic block Two 22b, 22c, 22d are electrically connected between the random combinational logic 24, 26. The random combinational logic 24 provides inputs into the predetermined ones 22b, 22c, 22d of the IP logic block Two. The predetermined ones 22b, 22c, 22d of IP logic block Two provide outputs to the random combinational logic 26. In the design shown in FIG. 1, three 22b, 22c, 22d of the four instances of IP logic block Two are required. The remaining one 22a of IP logic block Two is unused.

In the example shown in FIG. 1, when an electrical test is performed on the die, if IP logic block Two 22c fails because of a manufacturing defect, the entire die is considered to be a failure and is therefore not used. This results in lower yield. This is despite the availability of a redundant one 22a of IP logic block Two which, had redundant IP logic block Two 22a been selected and used, the die would have passed the electrical test.

OBJECTS AND SUMMARY

A general object of an embodiment of the present invention is to provide a system for enhancing yield in programmable logic.

Another general object of an embodiment of the present invention is to provide a system which utilizes redundant logic provided to enhance yield.

A further object of an embodiment of the present invention is to provide a system which provides for lower manufacturing costs.

Briefly, and in accordance with at least one of the foregoing objects, an embodiment of the present invention provides a system for yield enhancement in programmable logic. The system includes first random combinational logic, second random combinational logic, a first set of IP logic blocks, a first controller, a second set of IP logic blocks and a second controller. The first set of IP logic blocks are formed from a plurality of like-formed IP logic blocks. The first controller is electrically connected between the first random combinational logic and each of the IP logic blocks in the first set and electrically connected between each of the IP logic blocks in the first set and the second random combinational logic. The first controller is configured to test the IP logic blocks in the first set for functionality or non-functionality, to identify functional ones of the IP logic blocks in the first set and to provide electrical connections between a predetermined number of the functional IP logic blocks in the first set and the first random combinational logic and between the predetermined number of functional IP logic blocks in the first set and the second random combination logic. The second set of IP logic blocks are formed from a plurality of like-formed IP logic blocks which are different than the first set. The second controller is electrically connected between the first random combinational logic and each of the IP logic blocks in the second set and electrically connected between each of the IP logic blocks in the second set and the second random combinational logic. The second controller is configured to test the IP logic blocks in the second set for functionality or non-functionality, to identify functional ones of the IP logic blocks in the second set and to provide electrical connections between a predetermined number of the functional IP logic blocks in the second set and the first random combinational logic and between the predetermined number of functional IP logic blocks in the second set and the second random combination logic. Each of the controllers are preferably BIST/MUX controllers.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION OF THE ILLUSTRATED EMBODIMENT

Figure 1:
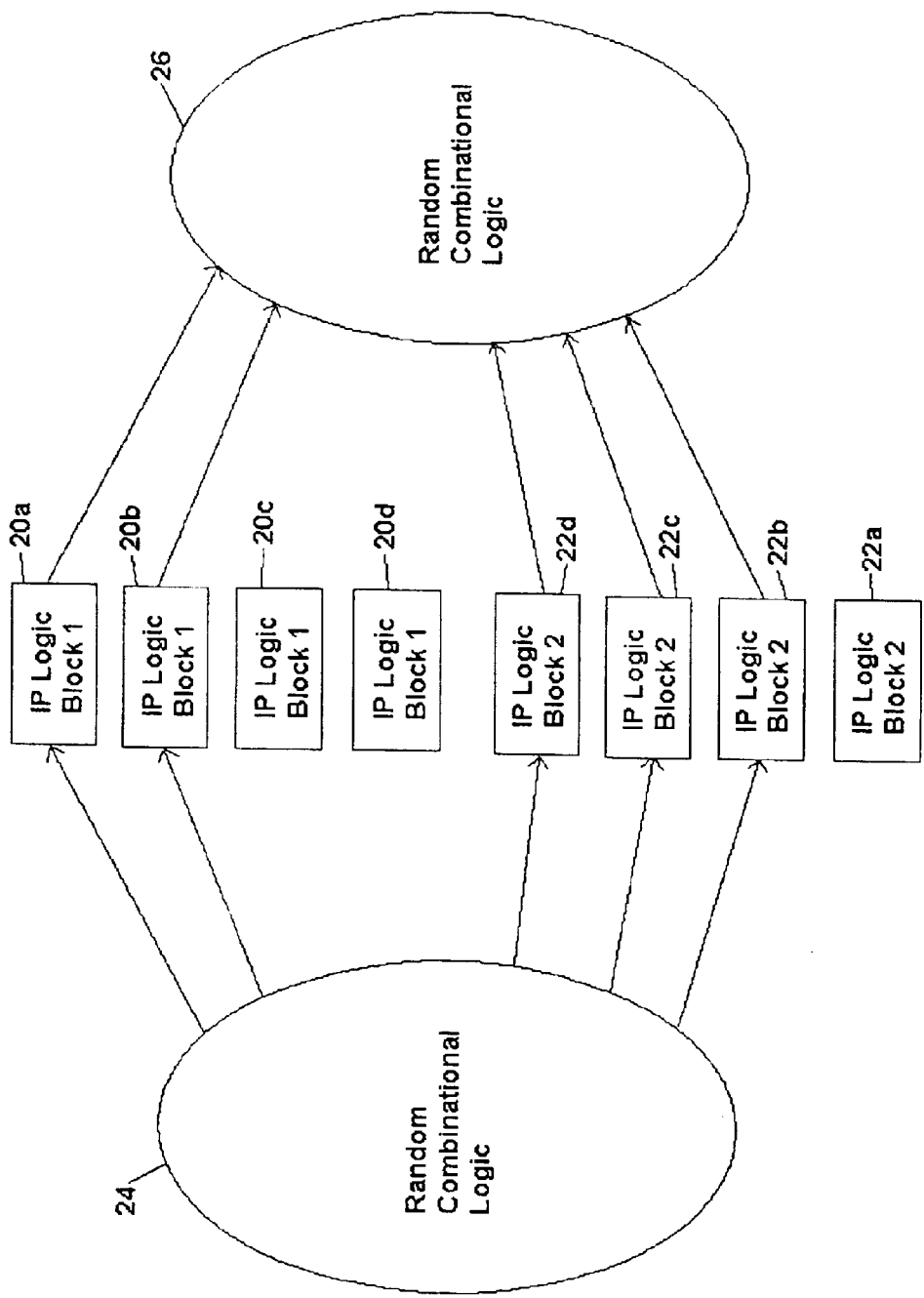
FIG 1 illustrates a system formed in accordance with the prior art.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Programmable/configurable technologies, such as RAPID CHIP™ technology, rely upon a base configuration that includes several different types of standard intellectual property (IP) logic blocks, such as memory blocks, processors (ARM, MIPS, ZSP) or special types of inputs/outputs (IOs), such as those sold under the registered trademarks GIGA-BLAZE® and HYPERPHY®. To save money, the base configuration is built using a standard number of IP logic blocks. In many cases, the designs may not use all of the IP logic blocks available in the base configuration. The unused IP logic blocks take up space, but do not contribute to the functionality of the design. The present invention utilizes the unused, functional IP logic blocks by swapping same with IP logic blocks that are defective because of manufacturing defects.

Figure 2:
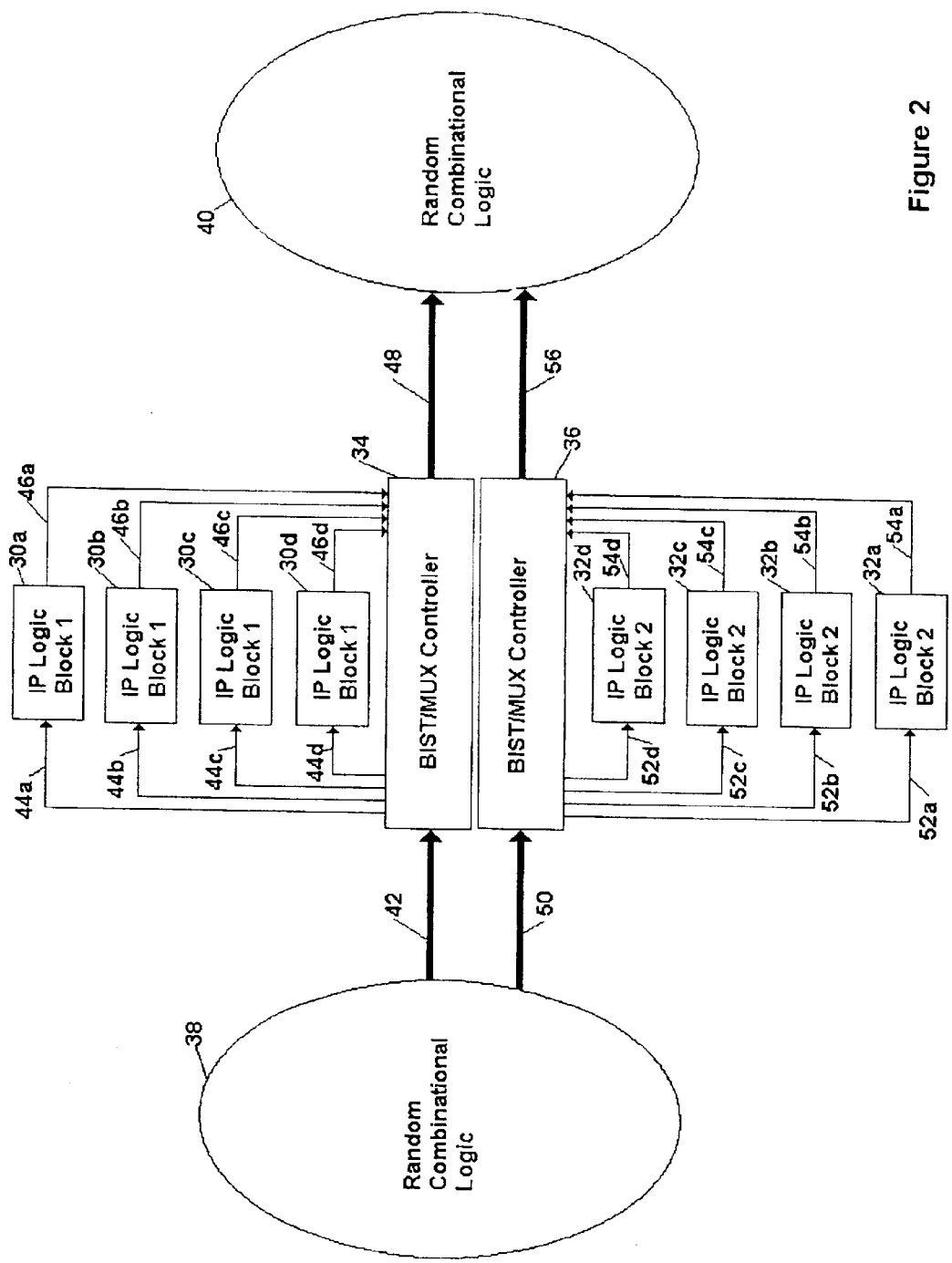
FIG 2 illustrates a system in accordance with a specific embodiment of the present invention.

FIG. 2 shows a design which is in accordance with an embodiment of the present invention. Like the prior art design of FIG. 1, the design of FIG. 2 is built with a base configuration that includes two sets of IP logic blocks 30a, 30b, 30c, 30d; 32a, 32b, 32c, 32d provided on a die. As shown, there are two sets of IP logic blocks, i.e. IP logic block One 30a, 30b, 30c, 30d and IP logic block Two 32a, 32b, 32c, 32d, and there are four instances of each IP logic block 30a, 30b, 30c, 30d; 32a, 32b, 32c, 32d provided on the die. Each IP logic block 30a, 30b, 30c, 30d in the first set includes the same IP. Each IP logic block 32a, 32b, 32c, 32d in the second set includes the same IP. The IP in each set, however, may differ as to what is provided therein.

The design shown in FIG. 2 is modified from the prior art design shown in FIG. 1 by the addition of two controllers 34, 36, which are preferably BIST/MUX (Built-in Self-Test/multiplexer) controllers, between random combinational logic 38, 40 and the IP logic blocks 30a, 30b, 30c, 30d; 32a, 32b, 32c, 32d. A first BIST/MUX controller 34 is provided between the random combinational logic 38,40 and the four IP logic block One 30a, 30b, 30c, 30d. A second BIST/MUX controller 36 is provided between the random combinational logic 38, 40 and the four IP logic blocks Two 32a, 32b, 32c, 32d.

The random combinational logic 38 is electrically connected to the first BIST/MUX controller 34 by line 42. The first BIST/MUX controller 34 is electrically connected to and provides an input to each of the IP logic block One 30a, 30b, 30c, 30d by respective lines 44a, 44b, 44c, 44d. Each IP logic block One 30a, 30b, 30c, 30d is electrically connected to and provides an output to the first BIST/MUX controller 34 by respective lines 46a, 46b, 46c, 46d. In turn, the first BIST/MUX controller 34 is electrically connected to the random combinational logic 40 by line 48. The first BIST/MUX controller 34 is configured (i.e., includes a stored program) to test and select the functional IP logic blocks in the set of IP logic blocks 30a, 30b, 30c, 30d required for the design application.

Likewise, the random combinational logic 38 is electrically connected to the second BIST/MUX controller 36 by line 50. The second BIST/MUX controller 36 is electrically connected to and provides inputs to each of the IP logic block Two 32a, 32b, 32c, 32d by respective lines 52a, 52b, 52c, 52d. Each IP logic block Two 32a, 32b, 32c, 32d is electrically connected to and provides outputs to the second BIST/MUX controller 36 by respective lines 54a, 54b, 54c, 54d. In turn, the second BIST/MUX controller 36 is electrically connected to the random combinational logic 40 by line 56. The second BIST/MUX controller 36 is configured (i.e., includes a stored program) to test and select the functional IP logic blocks in the set of IP logic blocks 32a, 32b, 32c, 32d required for the design application.

Like the prior art design shown in FIG. 1, the design shown in FIG. 2 only requires two instances of IP logic block One and three instances of IP logic block Two. In the die shown in FIG. 2, IP logic block Two 32c is defective because of a manufacturing defect. The remaining ones of IP logic block Two 32a, 32b, 32d are functional.

In use, the random combinational logic 38 sends a signal to the first BIST/MUX controller 34. Under program control, the first BIST/MUX controller 34 selects IP logic block One 30a and tests IP logic block One 30a to determine if it is functional. If the first BIST/MUX controller 34 determines that IP logic block One 30a is functional, the first BIST/MUX controller 34 establishes an electrical connection between the random combinational logic 38, the IP logic block One 30a and the random combinational logic 40. If the first BIST/MUX controller 34 determines that the IP logic block One 30a is defective, the electrical connection is not established by the first BIST/MUX controller 34. The first BIST/MUX controller 34 then tests the next IP logic block One 30b to determine if it is functional. If the first BIST/MUX controller 34 determines that IP logic block One 30b is functional, the first BIST/MUX controller 34 establishes an electrical connection between the random combinational logic 38, the IP logic block One 30b and the random combinational logic 40. This is repeated until the desired number of functional IP logic blocks are identified and the appropriate electrical connections are made. The BIST/MUX controller 34 is preferably configured such that once the BIST/MUX controller 34 identifies and establishes the appropriate electrical connections to the preselected required number of IP logic blocks, the remaining IP logic blocks are not tested for functionality. In the example illustrated, all of the IP logic block One 30a, 30b, 30c, 30d are functional. Therefore, because only two IP logic block One 30a, 30b are required for the design application and all IP logic block One are functional, the two remaining IP logic block One 30c, 30d are not tested for functionality (if the BIST/MUX controller 34 is programmed in this manner).

The random combinational logic 38 also sends a signal to the second BIST/MUX controller 36. The second BIST/MUX controller 36 selects IP logic block Two 32a and tests IP logic block Two 32a to determine if it is functional. If the second BIST/MUX controller 36 determines that IP logic block Two 32a is functional, the second BIST/MUX controller 36 establishes an electrical connection between the random combinational logic 38, the IP logic block Two 32a and the random combinational logic 40. If the second BIST/MUX controller 36 determines that the IP logic block Two 32a is defective, the electrical connection is not established by the second BIST/MUX controller 36. The second BIST/MUX controller 36 then tests the next IP logic block Two 32b to determine if it is functional. If the second BIST/MUX controller 36 determines that IP logic block Two 32b is functional, the second BIST/MUX controller 36 establishes an electrical connection between the random combinational logic 38, the IP logic block Two 32b and the random combinational logic 40. This is repeated until the desired number of functional IP logic blocks are identified and the appropriate electrical connections are made. In the example illustrated, IP logic block Two 32c is not functional because of a manufacturing defect. Therefore, when the second BIST/MUX controller 36 tests IP logic block Two 32c, the second BIST/MUX controller 36 will determine that IP logic block Two 32c is not functional and no electrical connection will be made between the random combinational logic 38, the IP logic block Two 32c and the random combinational logic 40. The second BIST/MUX controller 36 will test the remaining IP logic block Two 32d for functionality. The BIST/MUX controller 36 is preferably configured such that once the second BIST/MUX controller 36 identifies and establishes the appropriate electrical connections to the preselected required number of IP logic blocks, the remaining IP logic blocks are not tested for functionality.

As a result, because all of the required electrical connections have been made with functional IP logic blocks 30a, 30b; 32a, 32b, 32d, the die will pass electrical testing. Even though the die has a defective IP logic block Two 32c, the die will not be considered to be a failure. Thus, yield is increased and this results in lower manufacturing costs.

The BIST portions of the BIST/MUX controllers 34, 36 can be implemented such that reliability defects can be compensated for by performing a self-diagnostic in the field and mapping an alternate IP logic block when a malfunction is detected in a selected IP logic block.

The MUX portions of the BIST/MUX controllers 34, 36 can be implemented using permanent or non-permanent solutions. Permanent solutions are similar to memory fuses that are cut using a laser prior to assembly of the final product. Non-permanent solution include registers that are programmed each time the part is powered up. Additionally, other combinations including EEPROM registers could be used to allow non-volatile storage and at the same time the ability to modify the solution after final package assembly. This solution has the added advantage of allowing the part to self-diagnosis failure over time and then pick the solution that shows an acceptable failure rate.

While the system is described with respect to two sets of IP logic blocks 30a, 30b, 30c, 30d; 32a, 32b, 32c, 32d, it is to be understood that any number of sets of IP logic blocks can be used (including a single set), provided each set has an associated BIST/MUX controller. In addition, while the example discussed provides four of each of the IP logic blocks 30a, 30b, 30c, 30d; 32a, 32b, 32c, 32d, any number greater than one can be provided in each set of IP logic blocks. Furthermore, while the example discussed herein uses two of the four IP logic block One and the three of the four IP logic block Two, any number of IP logic blocks can be used in each set, provided there is at least one redundant unused IP logic block provided in the design.

While an embodiment of the present invention is shown and described, it is envisioned that those skilled in the art may devise various modifications of the present invention without departing from the spirit and scope of the appended claims.

What is claimed is:

1. A system for yield enhancement in programmable logic comprising:
   first random combinational logic;
   a plurality of like-formed IP logic blocks;
   second random combinational logic;
   a controller electrically connected between said first random combinational logic and each of said IP logic blocks and electrically connected between each of said IP logic blocks and said second random combinational logic, said controller being configured to test said IP logic blocks for functionality or non-functionality, to identify functional ones of said IP logic blocks and to provide electrical connections between a predetermined number of said functional IP logic blocks and said first random combinational logic and between said predetermined number of functional IP logic blocks and said second random combination logic.

2. A system as defined in claim 1, wherein said controller comprises a BIST/MUX controller.

3. A system as defined in claim 2, wherein said BIST/MUX controller is formed from a BIST portion and a MUX portion and wherein said BIST portion is configured to perform a self-diagnostic in the field and to map an alternate IP logic block when a malfunction is detected in a previously selected IP logic block.

4. A system as defined in claim 2, wherein said BIST/MUX controller is formed from a BIST portion and a MUX portion and wherein said MUX portion is implemented using a permanent solution.

5. A system as defined in claim 2, wherein said BIST/MUX controller is formed from a BIST portion and a MUX portion and wherein said MUX portion is implemented using a nonpermanent solution.

6. A system for yield enhancement in programmable logic comprising:
   first random combinational logic;
   second random combinational logic;
   a first set of IP logic blocks, said first set being formed from a plurality of like-formed IP logic blocks;
   a first controller electrically connected between said first random combinational logic and each of said IP logic blocks in said first set and electrically connected between each of said IP logic blocks in said first set and said second random combinational logic, said first controller being configured to test said IP logic blocks in said first set for functionality or non-functionality, to identify functional ones of said IP logic blocks in said first set and to provide electrical connections between a predetermined number of said functional IP logic blocks in said first set and said first random combinational logic and between said predetermined number of functional IP logic blocks in said first set and said second random combination logic;
   a second set of IP logic blocks, said second set being formed from a plurality of like-formed IP logic blocks;
   a second controller electrically connected between said first random combinational logic and each of said IP logic blocks in said second set and electrically connected between each of said IP logic blocks in said second set and said second random combinational logic, said second controller being configured to test said IP logic blocks in said second set for functionality or non-functionality, to identify functional ones of said IP logic blocks in said second set and to provide electrical connections between a predetermined number of said functional IP logic blocks in said second set and said first random combinational logic and between said predetermined number of functional IP logic blocks in said second set and said second random combination logic.

7. A system as defined in claim 6, wherein said first controller comprises a BIST/MUX controller.

8. A system as defined in claim 6, wherein said second controller comprises a BIST/MUX controller.

9. A system as defined in claim 6, wherein said first controller comprises a BIST/MUX controller and said second controller comprises a BIST/MUX controller.

10. A system as defined in claim 6, wherein said first set of IP logic blocks is different than said second set of IP logic blocks.

11. A method of enhancing yield in programmable logic comprising the steps of:
    providing first random combinational logic, a plurality of like-formed IP logic blocks, second random combinational logic, and a controller electrically connected between said first random combinational logic and each of said IP logic blocks and electrically connected between each of said IP logic blocks and said second random combinational logic;
    using said controller to test said IP logic blocks for functionality or non-functionality;
    using said controller to identify functional ones of said IP logic blocks; and using said controller to provide electrical connections between a predetermined number of said functional IP logic blocks and said first random combinational logic; and using said controller to provide electrical connections between said predetermined number of functional IP logic blocks and said second random combination logic.

12. A method as defined in claim 11, wherein said controller comprises a BIST/MUX controller.

13. A method of enhancing yield in programmable logic comprising the steps of:

providing first random combinational logic and second random combinational logic;

providing a first set of a plurality of like-formed IP logic blocks;

providing a first controller electrically connected between said first random combinational logic and each of said IP logic blocks in said first set and electrically connected between each of said IP logic blocks in said first set and said second random combinational logic;

using said first controller to test said IP logic blocks in said first set for functionality or non-functionality;

using said first controller to identify functional ones of said IP logic blocks in said first set;

using said first controller to provide electrical connections between a predetermined number of said functional IP logic blocks in said first set and said first random combinational logic;

using said first controller to provide electrical connections between said predetermined number of functional IP logic blocks in said first set and said second random combination logic;

providing a second set of a plurality of like-formed IP logic blocks;

providing a second controller electrically connected between said first random combinational logic and each of said IP logic blocks in said second set and electrically connected between each of said IP logic blocks in said second set and said second random combinational logic;

using said second controller to test said IP logic blocks in said second set for functionality or non-functionality;

using said second controller to identify functional ones of said IP logic blocks in said second set;

using said second controller to provide electrical connections between a predetermined number of said functional IP logic blocks in said second set and said first random combinational logic; and using said second controller to provide electrical connections between said predetermined number of functional IP logic blocks in said second set and said second random combination logic.

14. A method as defined in claim 13, wherein said first controller comprises a BIST/MUX controller.

15. A method as defined in claim 13, wherein said second controller comprises a BIST/MUX controller.

16. A method as defined in claim 13, wherein said first controller comprises a BIST/MUX controller and said second controller comprises a BIST/MUX controller.

17. A method as defined in claim 13, wherein said first set of IP logic blocks is different than said second set of IP logic blocks.

* * * * *